US012660428B2

(12) United States Patent
Jia

(10) Patent No.: US 12,660,428 B2
(45) Date of Patent: Jun. 16, 2026

(54) DISPLAY SUBSTRATE WITH CENTRAL REGION WITH LOWER PIXEL DENSITY AND PREPARATION METHOD THEREOF, AND DISPLAY APPARATUS

(71) Applicants:Hefei BOE Joint Technology Co.,Ltd., Hefei (CN); BOE Technology Group Co., Ltd., Beijing (CN)

(72) Inventor: Wenbin Jia, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 19 days.

(21) Appl. No.: 18/783,461

(22) Filed: Jul. 25, 2024

(65) Prior Publication Data

US 2024/0389402 A1      Nov. 21, 2024

Related U.S. Application Data

(63) Continuation of application No. 16/924,194, filed on Jul. 9, 2020, now Pat. No. 12,120,921.

(30) Foreign Application Priority Data

Sep. 19, 2019    (CN) .......................... 201910886062.X

(51) Int. Cl.
*H10K 59/122*      (2023.01)
*H10K 71/13*      (2023.01)
*H10K 71/15*      (2023.01)

(52) U.S. Cl.
CPC ......... *H10K 59/122* (2023.02); *H10K 71/135* (2023.02); *H10K 71/15* (2023.02)

(58) Field of Classification Search
CPC ................................................... H10K 59/121
See application file for complete search history.

(56) References Cited

U.S. PATENT DOCUMENTS 10,453,828 B1 * 10/2019 Ouderkirk ............ H10H 29/142
2015/0053948 A1      2/2015 Matsushima
(Continued)

FOREIGN PATENT DOCUMENTS

CN          107819020 A      3/2018
CN          108063155 A      5/2018
(Continued)

OTHER PUBLICATIONS

Notice of Allowance dated Mar. 18, 2022 for Chinese Patent Application No. 201910886062.X and English Translation.
(Continued)

*Primary Examiner* — Peter Bradford
(74) *Attorney, Agent, or Firm* — Ling Wu; Stephen Yang; Ling and Yang Intellectual Property

(57)      ABSTRACT

A display substrate includes a peripheral display region and a central display region. Multiple first pixel units are regularly arranged within the peripheral display region, and multiple second pixel units are regularly arranged within the central display region. Pixels Per Inch of the first pixel units within the peripheral display region is greater than Pixels Per Inch of the second pixel units within the central display region; or, Pixels Per Inch of the first pixel units within the peripheral display region is equal to Pixels Per Inch of the second pixel units within the central display region, and an area of the first pixel unit is larger than an area of the second pixel unit.

14 Claims, 5 Drawing Sheets

(56)  References Cited

U.S. PATENT DOCUMENTS

| | | | |
|---|---|---|---|
| 2015/0261046 A1 | 9/2015 | Miki et al. | |
| 2017/0097535 A1* | 4/2017 | Andou | H10K 77/111 |
| 2018/0089485 A1 | 3/2018 | Bok | |
| 2019/0074337 A1 | 3/2019 | Xie et al. | |
| 2019/0189923 A1 | 6/2019 | Cui | |
| 2019/0305221 A1 | 10/2019 | Hou | |
| 2019/0310724 A1 | 10/2019 | Yeke Yazdandoost et al. | |
| 2019/0310817 A1 | 10/2019 | Ma et al. | |
| 2020/0091251 A1 | 3/2020 | Hu et al. | |
| 2021/0376016 A1* | 12/2021 | Hou | H10K 59/122 |

FOREIGN PATENT DOCUMENTS

| | | | | |
|---|---|---|---|---|
| CN | 108281476 A | | 7/2018 | |
| CN | 108336123 A | | 7/2018 | |
| CN | 108735790 A | * | 11/2018 | G09G 3/3233 |
| CN | 208368508 U | | 1/2019 | |
| CN | 109585490 A | | 4/2019 | |
| CN | 109697396 A | * | 4/2019 | G06V 40/1318 |
| CN | 110047386 A | * | 7/2019 | H04N 23/57 |
| EP | 3690947 A1 | | 8/2020 | |
| JP | H06282245 A | * | 10/1994 | |

OTHER PUBLICATIONS

Office Action dated Aug. 4, 2021 for Chinese Patent Application No. 201910886062.X and English Translation.

Restriction Requirements dated Mar. 18, 2022 for U.S. Appl. No. 16/924,194.

Office Action dated Sep. 13, 2023 for U.S. Appl. No. 16/924,194.

Office Action dated Nov. 20, 2023 for U.S. Appl. No. 16/924,194.

Advisory Action dated Jan. 25, 2024 for U.S. Appl. No. 16/924,194.

Notice of Allowance dated Jun. 17, 2024 for U.S. Appl. No. 16/924,194.

Office Action dated Dec. 28, 2022 for U.S. Appl. No. 16/924,194.

Office Action dated Mar. 30, 2023 for U.S. Appl. No. 16/924,194.

Advisory Action dated Jul. 7, 2023 for U.S. Appl. No. 16/924,194.

2nd Restriction Requirements dated Aug. 18, 2022 for U.S. Appl. No. 16/924,194.

Office Action dated Mar. 29, 2024 for U.S. Appl. No. 16/924,194.

* cited by examiner

DISPLAY SUBSTRATE WITH CENTRAL REGION WITH LOWER PIXEL DENSITY AND PREPARATION METHOD THEREOF, AND DISPLAY APPARATUS

CROSS-REFERENCE TO RELATED APPLICATION(S)

The present application is a continuation application of U.S. application Ser. No. 16/924,194 having an filing date of Jul. 9, 2020, which claims the priority to the Chinese Patent Application No. 201910886062.X, filed to the CNIPA on Sep. 19, 2019, the above-identified applications are incorporated by reference herein in their entirety.

TECHNICAL FIELD

The present disclosure relates to, but is not limited to, the technical field of display, in particular to a display substrate and a preparation method thereof, and a display apparatus.

BACKGROUND

An Organic Light-Emitting Diode (OLED), as a new type of light-emitting device, has shown great application potential in the field of display, and thus has attracted much attention from academia and industry. The OLED has advantages such as self-luminescence, fast response, wide viewing angle, high brightness, brilliant color, lightness and thinness, etc., compared with a Liquid Crystal Display (LCD), and is considered as the next generation of display technology.

At present, equipment and a process for manufacturing OLED products by using an ink-jet printing method are increasingly mature. A material used for manufacturing an OLED display substrate may be dissolved in a specific ink-jet printing solvent to form ink-jet printing ink, and the ink-jet printing ink is sprayed onto the substrate through a nozzle in an ink-jet printing apparatus to print a pixel pattern. However, there are still many problems in an ink-jet printing process. Since a difference exists in solvent atmosphere (i.e. drying atmosphere around ink) of ink-jet printing ink in an edge region and a central region in a Vacuum Dry (VCD) process of a large-size OLED display substrate, a solvent volatilization drying speed of the ink-jet printing ink in the edge region is higher than that in a central region of a panel. This causes poor film thickness uniformity, results in uneven display brightness of the display substrate, reduces effective pixel opening, and affects display effect and life.

SUMMARY

The following is a summary of the subject matter described in detail herein. This summary is not intended to limit the protection scope of the claims.

The present disclosure provides a display substrate and a preparation method thereof, and a display apparatus.

In one aspect, the present disclosure provides a display substrate, including a peripheral display region and a central display region. Multiple first pixel units are regularly arranged within the peripheral display region, and multiple second pixel units are regularly arranged within the central display region. Pixels Per Inch of the first pixel units within the peripheral display region may be greater than Pixels Per Inch of the second pixel units within the central display region; or, Pixels Per Inch of the first pixel units within the peripheral display region may be equal to Pixels Per Inch of the second pixel units within the central display region, and an area of the first pixel unit may be larger than an area of the second pixel unit.

In another aspect, the present disclosure provides a display apparatus, including a display substrate. The display substrate includes a peripheral display region and a central display region. Multiple first pixel units are regularly arranged within the peripheral display region, and multiple second pixel units are regularly arranged within the central display region. Pixels Per Inch of the first pixel units within the peripheral display region may be greater than Pixels Per Inch of the second pixel units within the central display region; or, Pixels Per Inch of the first pixel units within the peripheral display region may be equal to Pixels Per Inch of the second pixel units within the central display region, and an area of the first pixel unit may be larger than an area of the second pixel unit.

In another aspect, the present disclosure provides a preparation method of a display substrate, including: preparing multiple first pixel units regularly arranged in a peripheral display region, and preparing multiple second pixel units regularly arranged in a central display region. Herein, Pixels Per Inch of the first pixel units within the peripheral display region may be greater than Pixels Per Inch of the second pixel units within the central display region; or, Pixels Per Inch of the first pixel units within the peripheral display region may be equal to Pixels Per Inch of the second pixel units within the central display region, and an area of the first pixel unit may be larger than an area of the second pixel unit.

Other aspects may become apparent upon reading and understanding the brief description of the drawings and the embodiments of the present disclosure.

BRIEF DESCRIPTION OF THE DRAWINGS

Accompanying drawings are used to facilitate understanding of technical solutions of the present disclosure, and form a part of the specification. Together with embodiments of the present disclosure, they are used to explain technical solutions of the present disclosure, and do not constitute a limitation on the technical solutions of the present disclosure. Shapes and sizes of one or more components in the accompanying drawings do not reflect real proportions, and are only for a purpose of schematically illustrating contents of the present disclosure.

DETAILED DESCRIPTION

Figure 1:
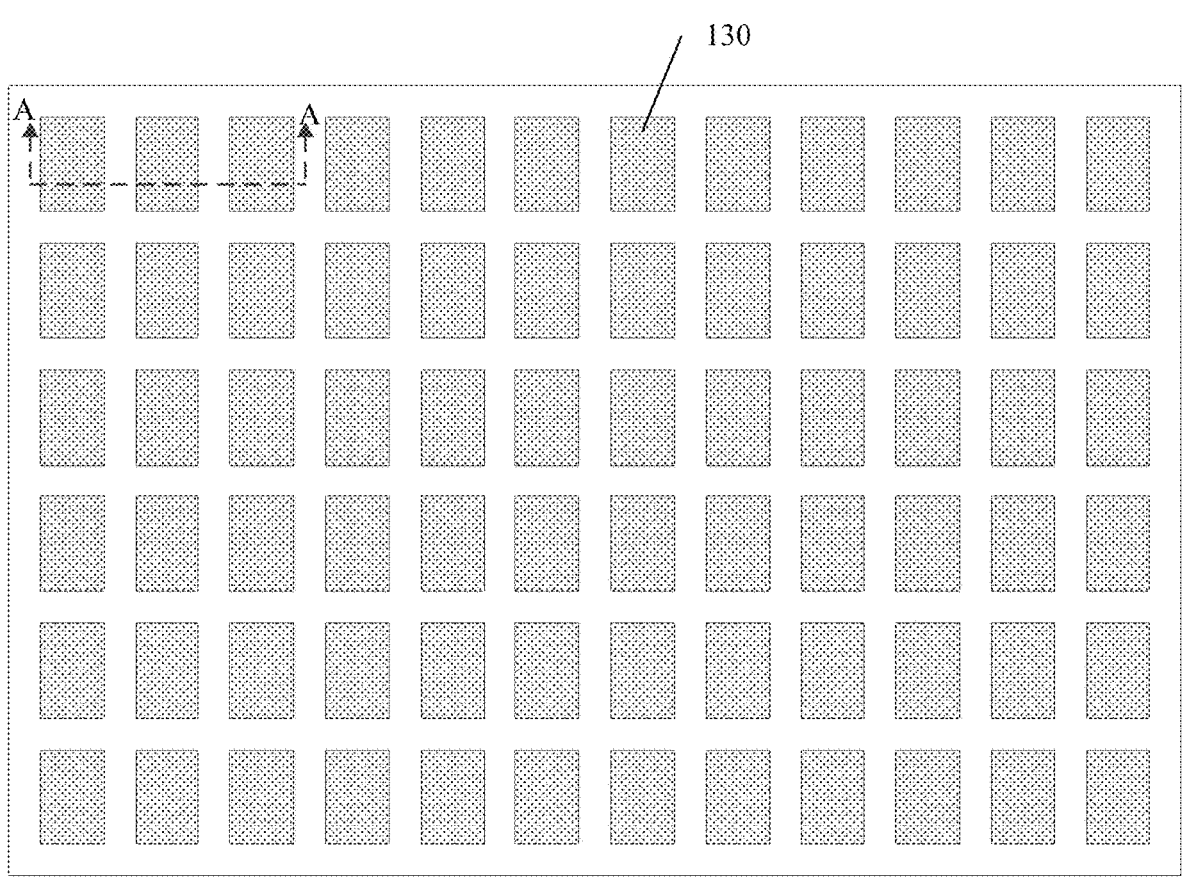
FIG. 1 is an exemplary diagram of a display substrate.

The present disclosure describes multiple embodiments, but the description is exemplary rather than limiting, and it is apparent for those of ordinary skill in the art that, there may be more embodiments and implementation solutions within the scope contained by the embodiments described in the present disclosure. Although many possible combinations of features are shown in the drawings, and have been discussed in embodiments, many other combinations of the disclosed features are also possible. Unless specifically limited, any feature or element of any embodiment may be used in combination with or in place of any other feature or element of any other embodiment.

The present disclosure includes and contemplates combinations of features and elements known to those of ordinary skill in the art. Embodiments, features and elements already disclosed in the present disclosure may also be combined with any conventional feature or element to form a unique inventive solution defined by the claims. Any feature or element of any embodiment may also be combined with a feature or an element from another inventive solution to form another unique inventive solution defined by the claims. Therefore, it should be understood that any of the features shown or discussed in the present disclosure may be implemented individually or in any suitable combination. Therefore, the embodiments are not limited except by the limitations made according to the appended claims and their equivalents. In addition, one or more modifications and variations may be made within the scope of protection of the appended claims.

In addition, when representative embodiments are described, the specification may have presented a method or a process as a specific act sequence. However, to an extent that the method or the process does not depend on a specific order of the acts described herein, the method or the process should not be limited to the described acts of the specific order. As one of ordinary skill in the art will understand, other orders of acts are also possible. Therefore, the specific order of the acts set forth in the specification should not be interpreted as limiting the claims. In addition, the claims aiming at the method or the process should not be limited to performing their acts in a written order, and those skilled in the art may readily understand that these orders may vary, and still remain within the spirit and the scope of the embodiments of the present disclosure.

Figure 2:
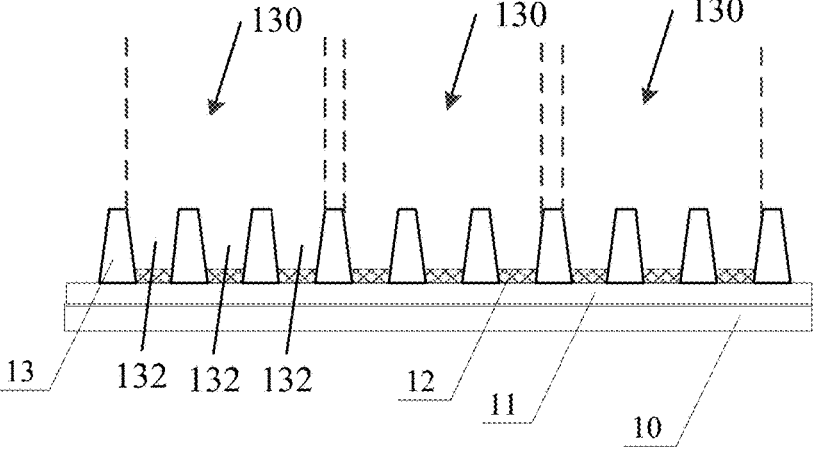
FIG. 2 is an exemplary sectional view of an A-A direction in FIG. 1.

FIG. 1 is an exemplary diagram of a display substrate; and FIG. 2 is an exemplary sectional view of an A-A direction in FIG. 1. As shown in FIG. 1, multiple pixel units 130 may be regularly arranged on a display substrate. As shown in FIG. 2, the display substrate may include a substrate 10, a driving structure layer 11 disposed on the substrate 10, an anode layer 12, and a pixel defining layer 13. Herein, the pixel defining layer 13 may have multiple opening regions 132 arranged in an array. Each opening region 132 may be configured to form one light emitting unit (i.e., one sub-pixel), such as a red (R) sub-pixel, a green (G) sub-pixel or a blue (B) sub-pixel. Herein, each opening region 132 may be used for containing an ink-jet printing solution in which a material of a light emitting functional layer of the sub-pixel of a corresponding color is dissolved, wherein the light emitting functional layer of the sub-pixel may be formed by an ink-jet printing method. A size of the opening region corresponding to each sub-pixel may be the same or different, for example, the opening region corresponding to the blue sub-pixel may be larger than the opening region corresponding to the red sub-pixel and the green sub-pixel. Herein, one pixel unit 130 may include three light emitting units (e.g., a red sub-pixel, a green sub-pixel, and a blue sub-pixel). As shown in FIGS. 1 and 2, sizes of the pixel units 130 formed based on the pixel defining layer 13 may be the same and Pixels Per Inch (PPI) of different regions on the display substrate may also be the same.

Based on the display substrate shown in FIGS. 1 and 2, in a VCD process of ink-jet printing, since solvent atmosphere of ink-jet printing ink in an edge region and a center region of the display substrate is different (i.e., drying atmosphere around the ink in the edge region is different from that around the ink in the center region), a solvent volatilization speed of the ink-jet printing ink in the edge region is higher than that in the center region. This will cause a problem of poor film thickness uniformity, thereby result in uneven display brightness of the display substrate, and affect display effect and life.

Embodiments of the disclosure provide a display substrate and a preparation method thereof and, a display apparatus. The film thickness uniformity is effectively improved by adjusting at least one of an area and Pixels Per Inch of a pixel unit, thereby the brightness uniformity, the effective pixel opening, the display effect and the life of the display substrate are improved.

The display substrate provided by the embodiment of the present disclosure may include a peripheral display region and a central display region. Multiple first pixel units are regularly arranged within the peripheral display region, and multiple second pixel units are regularly arranged within the central display region. Pixels Per Inch of the first pixel units within the peripheral display region may be greater than Pixels Per Inch of the second pixel units within the central display region; or, Pixels Per Inch of the first pixel units within the peripheral display region may be equal to Pixels Per Inch of the second pixel units within the central display region, and an area of the first pixel unit may be larger than an area of the second pixel unit.

In some examples, the display substrate may include a peripheral display region and a central display region, and the central display region extends outward in a direction away from a center to be the peripheral display region. In other words, there is continuity between the peripheral display region and the central display region. For example, the central display region in may be a rectangular area, and the peripheral display region may be an annular area surrounding the central display region.

In at least one exemplary embodiment, that the Pixels Per Inch of the first pixel units within the peripheral display region is greater than the Pixels Per Inch of the second pixel units within the central display region, may be achieved by any of following modes: a distance between adjacent first pixel units within the peripheral display region is smaller than a distance between adjacent second pixel units within the central display region, and an area of the first pixel unit is equal to an area of the second pixel unit; a distance between adjacent first pixel units within the peripheral display region is smaller than a distance between adjacent second pixel units within the central display region, and an area of the first pixel unit is larger than an area of the second pixel unit.

In at least one exemplary embodiment, a distance between adjacent first pixel units within the peripheral display region may be smaller than a distance between adjacent second pixel units within the central display region, and an area of the first pixel unit may be equal to an area of the second pixel unit. The display substrate may also satisfy at least one of following: a distance between adjacent first pixel units near the central display region is greater than a distance between adjacent first pixel units away from the central display region; a distance between adjacent second pixel units near the peripheral display region is smaller than a distance between adjacent second pixel units away from the peripheral display region; and in a boundary region between the peripheral display region and the central display region, a distance between adjacent first pixel units is smaller than a distance between adjacent second pixel units.

In at least one exemplary embodiment, a distance between adjacent first pixel units within the peripheral display region may be smaller than a distance between adjacent second pixel units within the central display region, and an area of the first pixel unit may be larger than an area of the second pixel unit. The display substrate may also satisfy at least one of following: an area of the first pixel unit near the central display region is smaller than an area of the first pixel unit away from the central display region; an area of the second pixel unit near the peripheral display region is larger than an area of the second pixel unit away from the peripheral display region; in a boundary region between the peripheral display region and the central display region, an area of the first pixel unit is larger than an area of the second pixel unit adjacent thereto; a distance between adjacent first pixel units near the central display region is greater than a distance between adjacent first pixel units away from the central display region; a distance between adjacent second pixel units near the peripheral display region is smaller than a distance between adjacent second pixel units away from the peripheral display region; and in the boundary region between the peripheral display region and the central display region, a distance between adjacent first pixel units is smaller than a distance between adjacent second pixel units.

In at least one exemplary embodiment, Pixels Per Inch of the first pixel units within the peripheral display region may be equal to Pixels Per Inch of the second pixel units within the central display region, and an area of the first pixel unit may be larger than an area of the second pixel unit. The display substrate may also satisfy at least one of following: an area of the first pixel unit near the central display region is smaller than an area of the first pixel unit away from the central display region; an area of the second pixel unit near the peripheral display region is larger than an area of the second pixel unit away from the peripheral display region; and in a boundary region between the peripheral display region and the central display region, an area of the first pixel unit is larger than an area of the second pixel unit adjacent thereto.

Technical solutions of embodiments of the present disclosure are described below through multiple exemplary embodiments.

Figure 3:
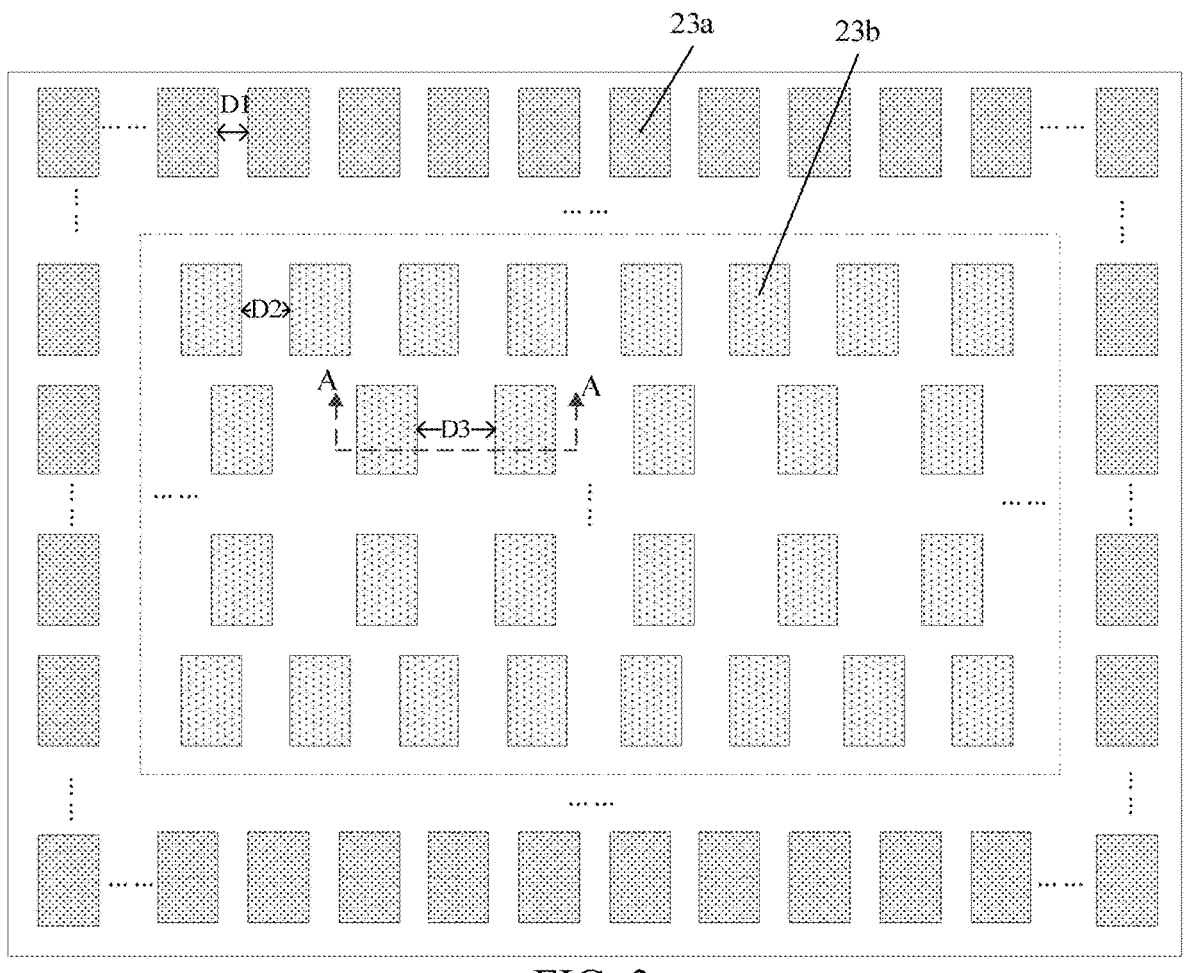
FIG. 3 is an exemplary diagram of a display substrate according to at least one embodiment of the present disclosure.
Figure 4:
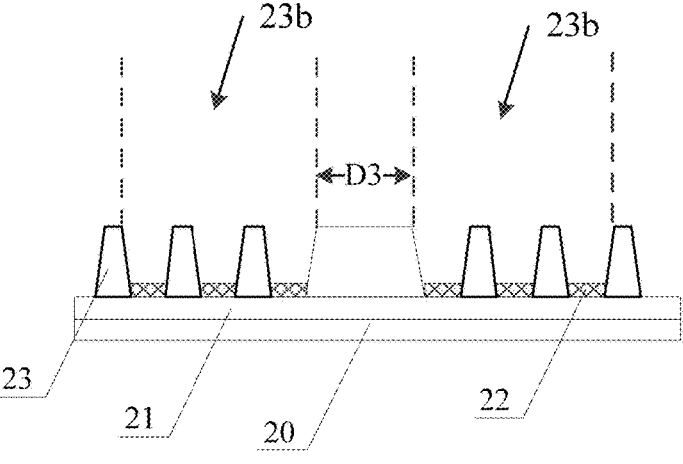
FIG. 4 is an exemplary sectional view of an A-A direction in FIG. 3.

FIG. 3 is an exemplary diagram of a display substrate according to at least one embodiment of the present disclosure. FIG. 4 is an exemplary sectional view of an A-A direction in FIG. 3. As shown in FIGS. 3 and 4, the display substrate provided by the present exemplary embodiment may include a peripheral display region (such as a region outside the dashed line frame in FIG. 3) and a central display region (such as a region inside the dashed line frame in FIG. 3). Herein, multiple first pixel units 23a may be regularly arranged within the peripheral display region, and multiple second pixel units 23b may be regularly arranged within the central display region.

In the present exemplary embodiment, Pixels Per Inch of the first pixel unit 23a within the peripheral display region may be greater than Pixels Per Inch of the second pixel unit 23b within the central display region. As shown in FIG. 3, a distance (e.g., distance D1) between adjacent first pixel units 23a within the peripheral display region may be smaller than a distance (e.g., distance D2 or D3) between adjacent second pixel units 23b within the central display region, and an area of the first pixel unit 23a may be equal to an area of the second pixel unit 23b.

As shown in FIG. 4, the display substrate may include a substrate 20, a driving structure layer 21 disposed on the substrate 20, an anode layer 22, and a pixel defining layer 23. Herein, the pixel defining layer 23 may include multiple opening regions regularly arranged, wherein each opening region may be configured to form one light emitting unit (e.g., a red sub-pixel, a green sub-pixel or a blue sub-pixel). Each pixel unit may include N light emitting units (corresponding to N opening regions). In the present exemplary embodiment, N may be 3. Each opening region may be rectangular or rectangular with rounded corners, and a cross-sectional shape of each opening region may be inverted trapezoid.

In the present exemplary embodiment, a distance between adjacent first pixel units near the central display region may be greater than a distance between adjacent first pixel units away from the central display region. A distance between adjacent second pixel units near the peripheral display region may be smaller than a distance between adjacent second pixel units away from the peripheral display region. In a boundary region between the peripheral display region and the central display region, a distance between adjacent first pixel units may be smaller than a distance between adjacent second pixel units. In other words, a distance between adjacent pixel units may gradually decrease from a center to an edge.

In at least one exemplary embodiment, the first pixel units within the peripheral display region may be arranged layer by layer around the central display region, and a distance between adjacent first pixel units in any layer may be smaller than a distance between first pixel units in its inner adjacent layer. The second pixel units within the central display region may be arranged layer by layer around a center of the display substrate, and a distance between adjacent second pixel units in any layer may be smaller than a distance between second pixel units in its inner adjacent layer. A distance between adjacent first pixel units in the innermost first pixel units in the peripheral display region is smaller than a distance between adjacent second pixel units in the outermost second pixel units in the adjacent central display region. As shown in FIG. 3, a distance D2 between adjacent second pixel units 23b in a layer of second pixel units 23b within the central display region may be smaller than a distance D3 between adjacent second pixel units 23b in an inner adjacent layer. However, this is not limited in the embodiment of the present disclosure. In some examples, a distance between adjacent first pixel units within the peripheral display region may be same, a distance between adjacent second pixel units within the central display region may be same, and a distance between adjacent first pixel units within the peripheral display region may be smaller than a distance between adjacent second pixel units within the central display region.

In at least one exemplary embodiment, within the peripheral display region, a ratio between a distance between adjacent first pixel units in any layer and a distance between adjacent first pixel units in its inner layer may be S1. Within the central display region, a ratio of a distance between adjacent second pixel units in any layer to a distance between adjacent second pixel units in its inner layer may be S2. S1 and S2 may both be less than 1; and S1 may be equal to S2. However, this is not limited in the embodiment of the present disclosure. In some examples, S1 may be greater than or less than S2.

As shown in FIGS. 3 and 4, pixel units may be arranged in a matrix form, for example, multiple pixel units may form an arrangement form of rows and columns. Herein, a first direction may be a row direction, and a second direction is a column direction. However, this is not limited in the embodiment of the present disclosure. In another implementation, the first direction may be a column direction, and the second direction may be a row direction.

As shown in FIG. 3, with a center of the display substrate as an inner side, a distance between adjacent pixel units in each layer may gradually increase from an edge to a center on the first direction (e.g., a row direction). However, this is not limited in the embodiment of the present disclosure. In at least one exemplary embodiment, a distance between adjacent pixel units in each layer may gradually increase from an edge to a center region only on the second direction; or, a distance between adjacent pixel units in each layer may gradually increase from an edge to a center region on both the first direction and the second direction.

The technical solution of the present embodiment is further illustrated below by an example of a process for preparing a display substrate of the present exemplary embodiment. The "patterning process" mentioned in the present embodiment includes processing such as deposition of a film layer, coating of photoresist, mask exposure, development, etching, and stripping of photoresist, and is a known mature preparation process. Deposition may be performed by using a known process such as sputtering, evaporation, chemical vapor deposition, or the like, coating may be performed by using a known coating process, and etching may be performed by using a known method, which is not limited here. In the description of the present embodiment, "thin film" may refer to a layer of thin film fabricated by taking a certain material on a base substrate using deposition or another process. When the "thin film" does not need a patterning process throughout the fabrication process, then the "thin film" may also be referred to as a "layer". When the "thin film" still needs a patterning process throughout the fabrication process, then it is referred to as a "thin film" before the patterning process and as a "layer" after the patterning process. The "layer" which has undergone a patterning process may contain at least one "pattern".

The process for preparing a display substrate of the present exemplary embodiment may include following acts.

(1) A driving structure layer 21 is formed on a substrate 20. A structure of the driving structure layer in the present exemplary embodiment may be the same as that of a known pixel driving circuit. In some examples, the driving structure layer may include multiple gate lines and multiple data lines, vertical intersection of the multiple gate lines and the multiple data lines may define multiple sub-pixels arranged in a matrix, 3 sub-pixels may be combined into one pixel unit, and each sub-pixel may include multiple Thin Film Transistors (TFTs) including a driving transistor. In the present exemplary embodiment, one pixel unit may include a red sub-pixel, a green sub-pixel and a blue sub-pixel. The solution of the present exemplary embodiment may also be applicable to a case where one pixel unit includes 4 sub-pixels. In the present exemplary embodiment, a known and mature preparation process may be used to form the driving structure layer. For example, the preparation process may include: preparing an active layer on a substrate of each sub-pixel by a patterning process, then forming a first insulating layer covering the active layer, forming a gate line and a gate electrode on the first insulating layer of each sub-pixel, then forming a second insulating layer covering the gate line and the gate electrode, forming a data line, a source electrode, and a drain electrode on the second insulating layer of each sub-pixel, and forming a third insulating layer covering the data line, the source electrode, and the drain electrode. The third insulating layer of each sub-pixel is provided with a first via exposing the drain electrode of the driving transistor.

Figure 5:
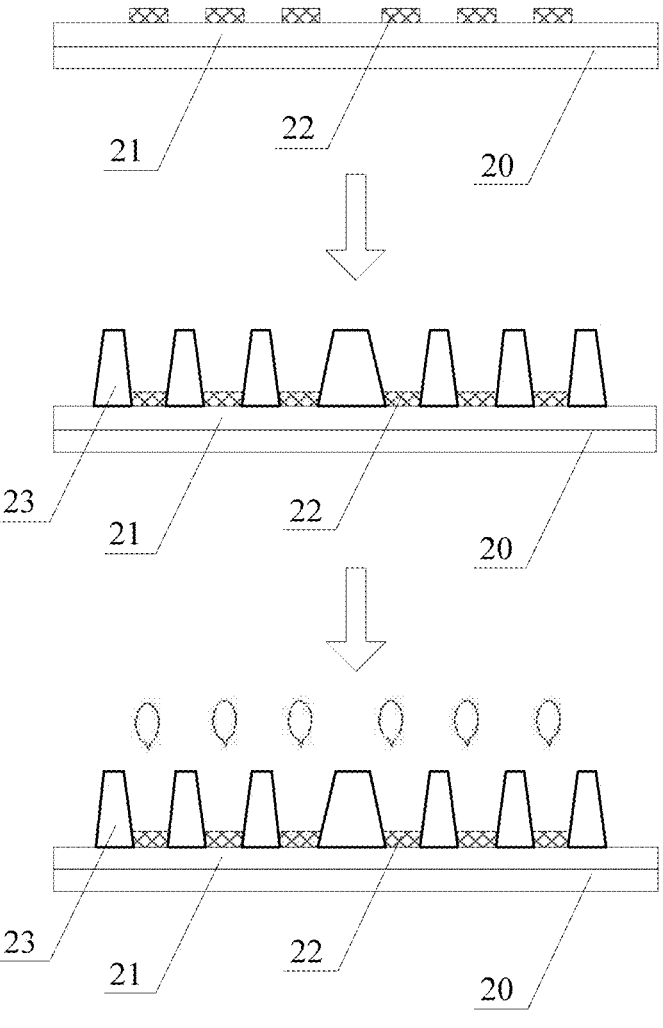
FIG. 5 is an exemplary flowchart of a preparation method of a display substrate according to at least one embodiment of the present disclosure.

(2) A transparent conductive thin film is deposited on the substrate 20 formed with the aforementioned structure, and the transparent conductive thin film is patterned through a patterning process to form an anode layer 22 pattern, as shown in FIG. 5. Herein, a material such as Indium Tin Oxide (ITO) or Indium Zinc Oxide (IZO), etc., may be used for the transparent conductive thin film.

(3) A pixel defining layer 23 is formed on the substrate 20 formed with the aforementioned pattern. Forming the pixel defining layer 23 may include: coating a pixel defining thin film on the substrate 20 formed with the aforementioned pattern, forming the pixel defining layer 23 through after masking, exposure and development, and defining an opening region for each sub-pixel in the pixel defining layer 23, wherein the opening region exposes an anode layer 22, as shown in FIG. 5. Herein, each pixel unit may include three sub-pixels (i.e., light emitting units). An area of a first pixel unit 23a within the peripheral display region may be equal to an area of a second pixel unit 23b within the central display region, and a distance between adjacent first pixel units 23a within the peripheral display region may be smaller than a distance between adjacent second pixel units 23b within the central display region, as shown in FIG. 3.

(4) An organic functional layer pattern is formed. Ink-jet printing is performed based on the pixel defining layer 23, wherein an organic functional solution is sprayed within the opening region defined in the pixel defining layer 23 by ink-jet printing to form an organic functional layer of the light emitting unit. Herein, the organic functional layer may be of a multilayer structure including, for example, a hole injection layer, a hole transport layer, an organic light emitting layer, an electron transport layer, an electron injection layer, or the like.

Taking the hole injection layer formed by ink-jet printing based on the pixel defining layer 23 as an example, a solvent concentration of a first organic functional solution sprayed within an opening region of the peripheral display region may be equal to a solvent concentration of a second organic functional solution sprayed within an opening region of the central display region. Herein, the organic functional solution used in ink-jet printing may include solute (a material forming the organic functional layer) and solvent.

After the organic functional layer is prepared through act (4), a cathode may be formed on the organic functional layer by using a process such as vacuum evaporation, thereby the preparation of the display substrate is completed.

In the present exemplary embodiment, Pixels Per Inch gradually decreases from an edge of the display substrate to a central region, then in an ink-jet printing process, an amount of solvent sprayed per unit area within the peripheral display region is larger than an amount of solvent sprayed per unit area within the central display region. Further, a solvent volatilization speed within the peripheral display region and a solvent volatilization speed within the central display region are balanced as much as possible to achieve an effect that the first organic functional solution sprayed within the peripheral display region and the second organic functional solution sprayed within the central display region are completely dried at a same time point or at close time points.

As may be seen from the above preparation process, according to the exemplary embodiment, through adjusting Pixels Per Inch within the peripheral display region and the central display region by adjusting a distance between pixel units within the peripheral display region and the central display region, a solvent volatilization speed within the peripheral display region and a solvent volatilization speed within the central display region may be balanced as much as possible in a VCD process of the display substrate. Thereby film formation uniformity is ensured, and brightness uniformity, display effect and life of the display substrate are improved.

In addition, the process for preparing the display substrate of the present exemplary embodiment does not add new processes or introduce new materials, does not need to change an existing process flow, does not need to change existing process equipment, and has good process compatibility, high process realizability, strong practicability, and good application prospect.

Figure 6:
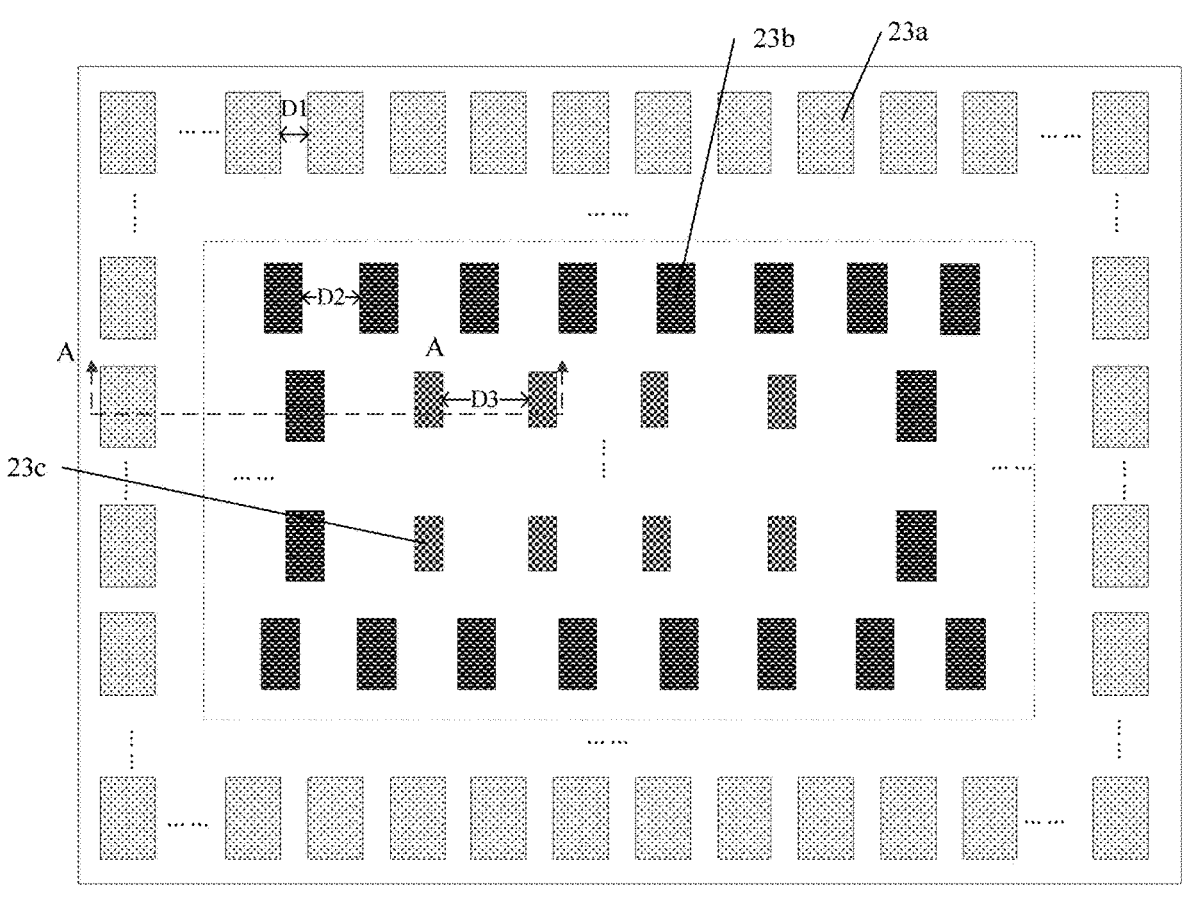
FIG. 6 is an exemplary diagram of a display substrate according to at least one embodiment of the present disclosure.
Figure 7:
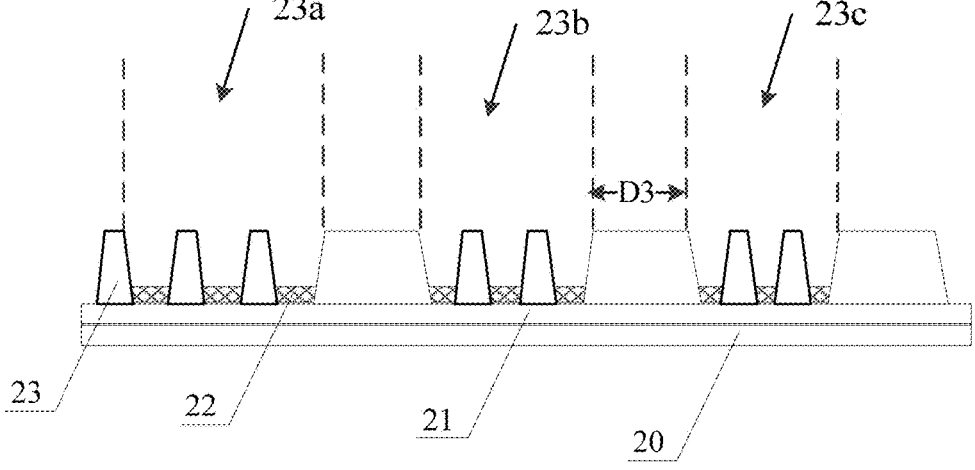
FIG. 7 is an exemplary sectional view of an A-A direction in FIG. 6.

FIG. 6 is an exemplary diagram of a display substrate according to at least one embodiment of the present disclosure. FIG. 7 is an exemplary sectional view of an A-A direction in FIG. 6. As shown in FIGS. 6 and 7, the display substrate provided by the present exemplary embodiment may include a peripheral display region (such as a region outside the dashed line frame in FIG. 6) and a central display region (such as a region inside the dashed line frame in FIG. 6). Herein, multiple first pixel units 23*a* may be regularly arranged within the peripheral display region, and multiple second pixel units (e.g., second pixel units 23*b* and 23*c*) may be regularly arranged within the central display region. An area of the first pixel unit 23*a* within the peripheral display region may be larger than an area of the second pixel unit (e.g., the second pixel units 23*b* and 23*c*) within the central display region.

As shown in FIGS. 6 and 7, in the present exemplary embodiment, the area of the first pixel unit 23*a* within the peripheral display region may be larger than the area of the second pixel unit within the central display region, and a distance (e.g., distance D1) between adjacent first pixel units 23*a* within the peripheral display region may be smaller than a distance (e.g., distance D2 or D3) between adjacent second pixel units within the central display region. In this way, Pixels Per Inch of the first pixel units within the peripheral display region may be greater than Pixels Per Inch of the second pixel units within the central display region.

In the present exemplary embodiment, a distance between adjacent first pixel units near the central display region may be greater than a distance between adjacent first pixel units away from the central display region. An area of the first pixel unit near the central display region may be smaller than an area of the first pixel unit away from the central display region. A distance between adjacent second pixel units near the peripheral display region may be smaller than a distance between adjacent second pixel units away from the peripheral display region. An area of the second pixel unit near the peripheral display region may be larger than an area of the second pixel unit away from the peripheral display region. In a boundary region between the peripheral display region and the central display region, an area of the first pixel unit may be larger than an area of the second pixel unit adjacent thereto, and a distance between adjacent first pixel units may be smaller than a distance between adjacent second pixel units. In other words, a distance between adjacent pixel units may gradually decrease from a center to an edge, and an area of pixel units may gradually decrease from the edge to the center.

In at least one exemplary embodiment, first pixel units within the peripheral display region may be arranged layer by layer around the central display region, and a distance between adjacent first pixel units in any layer may be smaller than a distance between adjacent first pixel units in its inner adjacent layer, and an area of the first pixel unit in any layer may be larger than an area of the first pixel unit in its inner adjacent layer. Second pixel units within the central display region may be arranged layer by layer around a center of the display substrate, and a distance between adjacent second pixel units in any layer is smaller than a distance between adjacent second pixel units in its inner adjacent layer, and an area of the second pixel unit in any layer may be larger than an area of the second pixel unit in its inner adjacent layer. A distance between adjacent first pixel units in the innermost first pixel unit of the peripheral display region may be smaller than a distance between adjacent second pixel units in the outermost second pixel unit of its adjacent central display region, and an area of the first pixel unit in the innermost first pixel unit of the peripheral display region may be larger than an area of the second pixel unit in the outermost second pixel unit of the central display region adjacent thereto. As shown in FIG. 6, a distance D2 between adjacent second pixel units in one layer of second pixel units within the central display region may be smaller than a distance D3 between second pixel units in an inner adjacent layer, and an area of the second pixel unit 23*b* may be larger than an area of the second pixel unit 23*c*. An area of the first pixel unit 23*a* may be larger than an area of the second pixel unit 23*b*.

According to the present exemplary embodiment, through adjusting Pixels Per Inch within the peripheral display region and the central display region by adjusting an area of pixel units within the peripheral display region and the central display region and a distance between adjacent pixel units, a solvent volatilization speed within the peripheral display region and a solvent volatilization speed within the central display region may be balanced as much as possible. Thereby film formation uniformity is ensured, and brightness uniformity, display effect and life of the display substrate are improved.

The description of the previous embodiment may be referred to for the process of preparing the display substrate provided in the present exemplary embodiment, which hence will not be repeated here. The structure (or method) shown in the present embodiment may be appropriately combined with the structure (or method) shown in another embodiment.

Figures 8, 9:
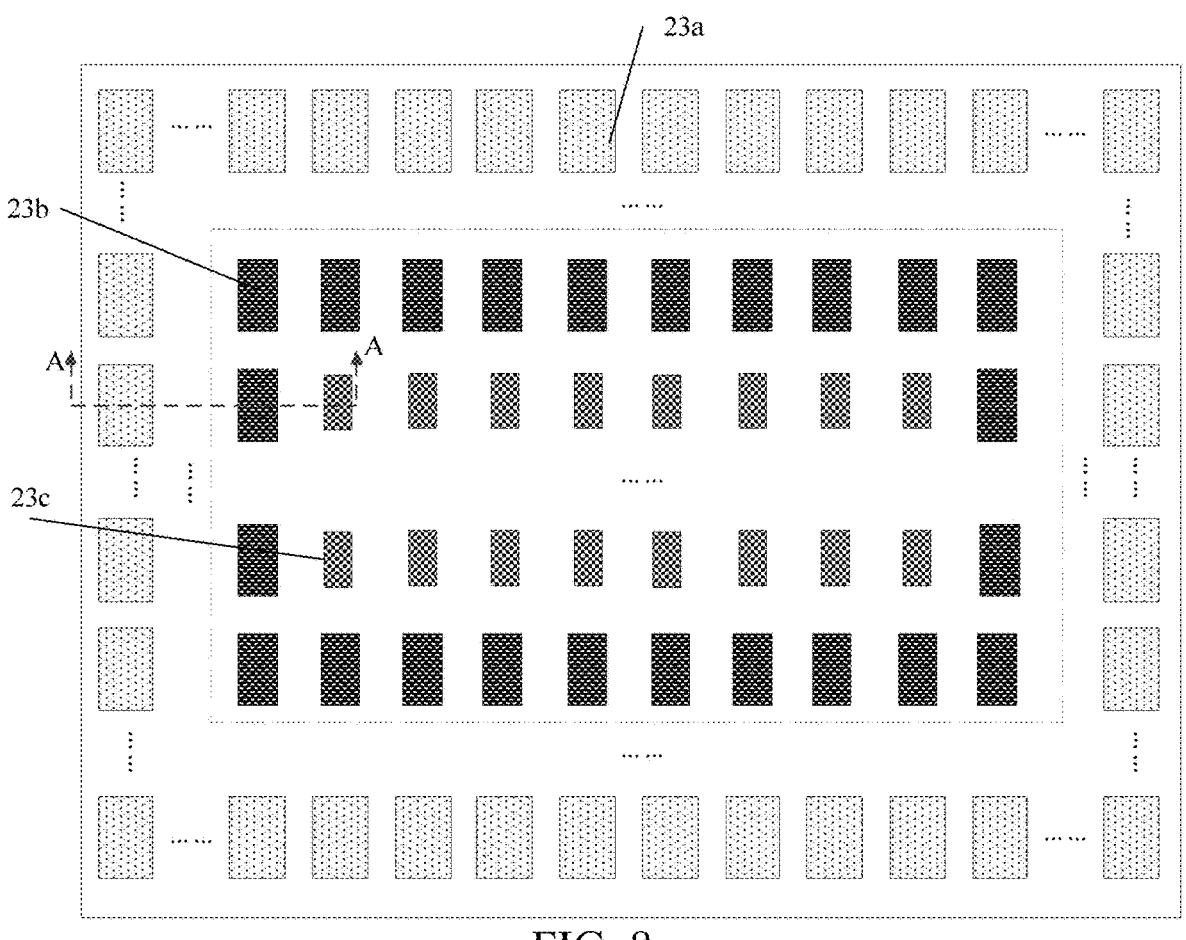
FIG. 8 is an exemplary diagram of a display substrate according to at least one embodiment of the present disclosure.
FIG. 9 is an exemplary sectional view of an A-A direction in FIG. 8.

FIG. 8 is an exemplary diagram of a display substrate according to at least one embodiment of the present disclosure; and FIG. 9 is an exemplary sectional view of an A-A direction in FIG. 8. As shown in FIGS. 8 and 9, the display substrate provided by the present exemplary embodiment may include a peripheral display region (such as a region outside the dashed line frame in FIG. 8) and a central display region (such as a region inside the dashed line frame in FIG. 8). Herein, multiple first pixel units 23a may be regularly arranged within the peripheral display region, and multiple second pixel units 23b and a second pixel unit 23c may be regularly arranged within the central display region. Herein, an area of the first pixel unit 23a may be larger than an area of the second pixel unit (for example, the second pixel units 23b and 23c), and Pixels Per Inch within the peripheral display region may be equal to Pixels Per Inch within the central display region.

As shown in FIG. 9, the display substrate of the present exemplary embodiment may include a substrate 20, a driving structure layer 21 disposed on the substrate 20, an anode layer 22 and a pixel defining layer 23. Herein, the pixel defining layer 23 may include multiple opening regions regularly arranged, wherein each opening region may be configured to form one light emitting unit (e.g., a red sub-pixel, a green sub-pixel or a blue sub-pixel). Each pixel unit may include N light emitting units (corresponding to N opening regions). In the present exemplary embodiment, N may be 3. Each opening region may be rectangular or rectangular with rounded corners, and a cross-sectional shape of each opening region may be inverted trapezoid.

In the present exemplary embodiment, an area of the first pixel unit near the central display region may be smaller than an area of the first pixel unit away from the central display region. An area of the second pixel unit near the peripheral display region may be larger than an area of the second pixel unit away from the peripheral display region. In a boundary region between the peripheral display region and the central display region, an area of the first pixel unit may be larger than an area of the second pixel unit adjacent thereto. In other words, an area of pixel units may gradually decrease from an edge to a center.

In at least one exemplary embodiment, the first pixel units within the peripheral display region may be arranged layer by layer around the central display region, and an area of the first pixel unit in any layer may be larger than an area of the first pixel unit in its inner adjacent layer. Second pixel units within the central display region may be arranged layer by layer around a center of the display substrate, and an area of the second pixel unit in any layer may be larger than an area of the second pixel unit in its inner adjacent layer. An area of the first pixel unit in the innermost first pixel unit of the peripheral display region may be larger than an area of the second pixel unit in the outermost second pixel unit of the central display region adjacent thereto. As shown in FIGS. 8 and 9, a width d1 of the first pixel unit 23a may be greater than a width d2 of the second pixel unit 23b, a width d2 of the second pixel unit 23b may be greater than a width d3 of the second pixel unit 23c, and a length of the first pixel unit 23a may also be greater than a length of the second pixel units 23b and 23c.

In the present exemplary embodiment, within the peripheral display region, a ratio between the area of the first pixel unit in any layer and the area of the first pixel unit in its inner layer may be S3. Within the central display region, a ratio of the area of the second pixel unit in any layer to the area of the second pixel unit in its inner layer may be S4. S3 and S4 may both be greater than 1, and S3 may be equal to S4. However, this is not limited in the embodiment of the present disclosure. In some examples, S3 may be greater than or less than S4.

As shown in FIG. 8, pixel units may be arranged in a matrix form, for example, multiple pixel units form an arrangement form in which rows and columns are aligned with each other. Herein, a first direction may be a row direction, and a second direction is a column direction. However, this is not limited in the embodiment of the present disclosure. In another implementation, the first direction may be a column direction, and the second direction may be a row direction.

As shown in FIG. 8, on the first direction (e.g., the row direction), an area of the pixel unit may gradually increase from a center to an edge region. On the second direction (e.g., the column direction), an area of the pixel unit may gradually increase from a center to an edge region. However, this is not limited in the embodiment of the present disclosure. In some examples, the area of the pixel unit may gradually increase from the center to the edge region only on the first direction; or, the area of the pixel unit may gradually increase from the center to the edge region only on the second direction.

The description of the above embodiment may be referred to for the process of preparing the display substrate provided in the present exemplary embodiment, which hence will not be repeated here. The structure (or method) shown in the present embodiment may be appropriately combined with the structure (or method) shown in another embodiment.

According to the present exemplary embodiment, through adjusting an area of pixel units within the peripheral display region and the central display region, a solvent volatilization speed within the peripheral display region and a solvent volatilization speed within the central display region may be balanced as much as possible. Thereby film formation uniformity is ensured, and brightness uniformity, display effect and life of the display substrate are improved.

In at least one exemplary embodiment, a solvent concentration of a first organic functional solution sprayed within the peripheral display region may be greater than a solvent concentration of a second organic functional solution sprayed within the central display region, when an organic functional layer is formed by ink-jet printing, in the process for preparing the display substrate. Description of the above embodiment may be referred to for the structure of the display substrate provided by the present exemplary embodiment, so it will not be repeated here.

In at least one exemplary embodiment, Pixels Per Inch within the peripheral display region may be greater than Pixels Per Inch within the central display region, and a solvent concentration of a first organic functional solution sprayed within an opening region of the peripheral display region may be greater than a solvent concentration of a second organic functional solution sprayed within an opening region of the central display region. In this way, solvent atmosphere of the peripheral display region and solvent atmosphere of the central display region may be balanced as much as possible to achieve an effect that the first organic functional solution sprayed within the peripheral display region and the second organic functional solution sprayed within the central display region are completely dried at a same time point or at close time points. Thereby film formation uniformity is ensured, and brightness uniformity, display effect and life of the display substrate are improved.

The present exemplary embodiment may be combined with any of the above embodiments to achieve an effect that the first organic functional solution sprayed within the peripheral display region and the second organic functional solution sprayed within the central display region are completely dried at a same time point or at close time points.

Thereby film formation uniformity is ensured, and brightness uniformity, display effect and life of the display substrate are improved.

An embodiment of the present disclosure further provides a preparation method of a display substrate to prepare the display substrate of the previous embodiment.

The preparation method of a display substrate provided by the present embodiment may include: preparing multiple first pixel units regularly arranged in a peripheral display region, and preparing multiple second pixel units regularly arranged in a central display region. Herein, Pixels Per Inch of the first pixel units within the peripheral display region may be greater than Pixels Per Inch of the second pixel units within the central display region; or, Pixels Per Inch of the first pixel units within the peripheral display region may be equal to Pixels Per Inch of the second pixel units within the central display region, and an area of the first pixel unit may be larger than an area of the second pixel unit.

In at least one exemplary embodiment, the first pixel unit may include N first light emitting units, and the second pixel unit may include N second light emitting units, wherein N is a positive integer. Preparing the multiple first pixel units regularly arranged in the peripheral display region and preparing the multiple second pixel units regularly arranged in the central display region, may include: preparing multiple first opening regions regularly arranged in the peripheral display region, and preparing multiple second opening regions regularly arranged in the central display region; spraying a first organic functional solution in the first opening region to form an organic functional layer of a first light emitting unit by ink-jet printing, and spraying a second organic functional solution in the second opening region to form an organic functional layer of a second light emitting unit, wherein a solvent concentration of the first organic functional solution may be greater than a solvent concentration of the second organic functional solution.

In at least one exemplary embodiment, the organic functional layer may be any one of following: a hole injection layer, a hole transport layer, an organic light emitting layer, an electron transport layer, an electron injection layer.

Description about the process for preparing the display substrate has been given in detail in the previous embodiment, which will not be repeated here.

An embodiment of the present disclosure also provides a display apparatus, which may include the display substrate as described in the previous embodiment. Herein, the display apparatus may be any product or component with a display function such as a mobile phone, a tablet computer, a television, a display, a notebook computer, a digital photo frame, a navigator, etc. The structure of the display substrate is described in the previous embodiment, which hence will not be repeated here.

In the description of embodiments of the present disclosure, azimuth or positional relationships indicated by terms "middle", "upper", "lower", "front", "rear", "vertical", "horizontal", "top", "bottom", "inside", "outside" and the like is based on the azimuth or the positional relationship shown in the drawings, which is only for ease of description of the present disclosure and simplification of the description, rather than indicating or implying that the apparatus or the element referred to must have a specific orientation, or must be constructed and operated in a particular orientation, and therefore they cannot be construed as limiting the present disclosure.

In the description of the embodiments of the present disclosure, the terms "installed", "connected" and "coupled" shall be broadly understood unless otherwise explicitly specified and defined. For example, it may be fixedly connected, or may be removable connected, or integrally connected; it may be mechanically connected, or may be electrically connected; it may be directly connected, or may be indirectly connected through middleware, or may be internal connection between two elements. Those of ordinary skilled in the art may understand the meanings of the above terms in the present disclosure according to situations.

Although implementations disclosed in the present disclosure are as the above, the described contents are only implementations for facilitating understanding the present disclosure, and are not used to limit the present disclosure. Any person skilled in the art to which the present disclosure pertains may make any modifications and variations in the form and details of implementation without departing from the spirit and the scope of the present disclosure, but the patent protection scope of the present disclosure shall still be subject to the scope defined in the appended claims.

The invention claimed is:

1. A display substrate, comprising: a peripheral display region and a central display region; multiple first pixel units being regularly arranged within the peripheral display region, and multiple second pixel units being regularly arranged within the central display region; wherein:

Pixels Per Inch of the first pixel units within the peripheral display region is greater than Pixels Per Inch of the second pixel units within the central display region;

the first pixel units within the peripheral display region are arranged in rectangularly shaped rings which are in an outward concentric arrangement around the central display region; the second pixel units within the central display region are arranged in rectangularly shaped rings which are in an outward concentric arrangement around a center of the display substrate, and an area of a second pixel unit in any rectangularly shaped ring is larger than an area of another second pixel unit in an inner rectangularly shaped ring adjacent to the any rectangularly shaped ring of the second pixel unit; an area of an innermost first pixel unit in the peripheral display region is larger than an area of an outermost second pixel unit in the central display region adjacent to the innermost first pixel unit; and that the Pixels Per Inch of the first pixel units within the peripheral display region is greater than the Pixels Per Inch of the second pixel units within the central display region, comprises: a distance between adjacent first pixel units within the peripheral display region is smaller than a distance between adjacent second pixel units within the central display region, and an area of the first pixel unit is larger than an area of the second pixel unit.

2. The display substrate according to claim 1, that the Pixels Per Inch of the first pixel units within the peripheral display region is greater than the Pixels Per Inch of the second pixel units within the central display region, comprises: a distance between adjacent first pixel units within the peripheral display region is smaller than a distance between adjacent second pixel units within the central display region.

3. The display substrate according to claim 2, wherein the display substrate further satisfies at least one of following:

a distance between adjacent first pixel units near the central display region is greater than a distance between adjacent first pixel units away from the central display region;

a distance between adjacent second pixel units near the peripheral display region is smaller than a distance between adjacent second pixel units away from the peripheral display region; and in a boundary region between the peripheral display region and the central display region, a distance between adjacent first pixel units is smaller than a distance between adjacent second pixel units.

4. The display substrate according to claim 1, wherein the display substrate further satisfies at least one of following:

an area of the first pixel unit near the central display region is smaller than an area of the first pixel unit away from the central display region;

an area of the second pixel unit near the peripheral display region is larger than an area of the second pixel unit away from the peripheral display region;

in a boundary region between the peripheral display region and the central display region, an area of the first pixel unit is larger than an area of the second pixel unit adjacent thereto;

a distance between adjacent first pixel units near the central display region is greater than a distance between adjacent first pixel units away from the central display region;

a distance between adjacent second pixel units near the peripheral display region is smaller than a distance between adjacent second pixel units away from the peripheral display region; and in the boundary region between the peripheral display region and the central display region, a distance between adjacent first pixel units is smaller than a distance between adjacent second pixel units.

5. The display substrate according to claim 1, wherein the first pixel unit comprises N first light emitting units, and the second pixel unit comprises N second light emitting units, wherein N is a positive integer;

wherein an organic functional layer of the first light emitting unit and an organic functional layer of the second light emitting unit are formed by ink-jet printing, and a solvent concentration of a first organic functional solution used to form the organic functional layer of the first light emitting unit is greater than a solvent concentration of a second organic functional solution used to form the organic functional layer of the second light emitting unit.

6. The display substrate according to claim 1, wherein the display substrate further satisfies at least one of following:

an area of the first pixel unit near the central display region is smaller than an area of the first pixel unit away from the central display region;

an area of the second pixel unit near the peripheral display region is larger than an area of the second pixel unit away from the peripheral display region; and in a boundary region between the peripheral display region and the central display region, an area of the first pixel unit is larger than an area of the second pixel unit adjacent thereto.

7. A display apparatus, comprising a display substrate, the display substrate comprising: a peripheral display region and a central display region; multiple first pixel units being regularly arranged within the peripheral display region, and multiple second pixel units being regularly arranged within the central display region; wherein:

Pixels Per Inch of the first pixel units within the peripheral display region is greater than Pixels Per Inch of the second pixel units within the central display region;

the first pixel units within the peripheral display region are arranged in rectangularly shaped rings which are in an outward concentric arrangement around the central display region; the second pixel units within the central display region are arranged in rectangularly shaped rings which are in an outward concentric arrangement around a center of the display substrate, and an area of a second pixel unit in any rectangularly shaped ring is larger than an area of another second pixel unit in an inner rectangularly shaped ring adjacent to the any rectangularly shaped ring of the second pixel unit; an area of an innermost first pixel unit in the peripheral display region is larger than an area of an outermost second pixel unit in the central display region adjacent to the innermost first pixel unit; and wherein that the Pixels Per Inch of the first pixel units within the peripheral display region is greater than the Pixels Per Inch of the second pixel units within the central display region, comprises: a distance between adjacent first pixel units within the peripheral display region is smaller than a distance between adjacent second pixel units within the central display region, and an area of the first pixel unit is larger than an area of the second pixel unit.

8. The display apparatus according to claim 7, that the Pixels Per Inch of the first pixel units within the peripheral display region is greater than the Pixels Per Inch of the second pixel units within the central display region, comprises: a distance between adjacent first pixel units within the peripheral display region is smaller than a distance between adjacent second pixel units within the central display region.

9. The display apparatus according to claim 8, wherein the display substrate further satisfies at least one of following:

a distance between adjacent first pixel units near the central display region is greater than a distance between adjacent first pixel units away from the central display region;

a distance between adjacent second pixel units near the peripheral display region is smaller than a distance between adjacent second pixel units away from the peripheral display region; and in a boundary region between the peripheral display region and the central display region, a distance between adjacent first pixel units is smaller than a distance between adjacent second pixel units.

10. The display apparatus according to claim 7, wherein the display substrate further satisfies at least one of following:

an area of the first pixel unit near the central display region is smaller than an area of the first pixel unit away from the central display region;

an area of the second pixel unit near the peripheral display region is larger than an area of the second pixel unit away from the peripheral display region;

in a boundary region between the peripheral display region and the central display region, an area of the first pixel unit is larger than an area of the second pixel unit adjacent thereto;

a distance between adjacent first pixel units near the central display region is greater than a distance between adjacent first pixel units away from the central display region;

a distance between adjacent second pixel units near the peripheral display region is smaller than a distance between adjacent second pixel units away from the peripheral display region; and in the boundary region between the peripheral display region and the central display region, a distance between adjacent first pixel units is smaller than a distance between adjacent second pixel units.

11. The display apparatus according to claim 7, wherein the first pixel unit comprises N first light emitting units, and the second pixel unit comprises N second light emitting units, wherein N is a positive integer;

wherein an organic functional layer of the first light emitting unit and an organic functional layer of the second light emitting unit are formed by ink-jet printing, and a solvent concentration of a first organic functional solution used to form the organic functional layer of the first light emitting unit is greater than a solvent concentration of a second organic functional solution used to form the organic functional layer of the second light emitting unit.

12. The display apparatus according to claim 7, wherein the display substrate further satisfies at least one of following:

an area of the first pixel unit near the central display region is smaller than an area of the first pixel unit away from the central display region;

an area of the second pixel unit near the peripheral display region is larger than an area of the second pixel unit away from the peripheral display region;

in a boundary region between the peripheral display region and the central display region, an area of the first pixel unit is larger than an area of the second pixel unit adjacent thereto.

13. A preparation method of a display substrate, comprising:

preparing multiple first pixel units regularly arranged in a peripheral display region, and preparing multiple second pixel units regularly arranged in a central display region; wherein:

Pixels Per Inch of the first pixel units within the peripheral display region is greater than Pixels Per Inch of the second pixel units within the central display region;

the first pixel units within the peripheral display region are arranged in rectangularly shaped rings which are in an outward concentric arrangement around the central display region; the second pixel units within the central display region are arranged in rectangularly shaped rings which are in an outward concentric arrangement around a center of the display substrate, and an area of a second pixel unit in any rectangularly shaped ring is larger than an area of another second pixel unit in an inner rectangularly shaped ring adjacent to the any rectangularly shaped ring of the second pixel unit; an area of an innermost first pixel unit in the peripheral display region is larger than an area of an outermost second pixel unit in the central display region adjacent to the innermost first pixel unit; and that the Pixels Per Inch of the first pixel units within the peripheral display region is greater than the Pixels Per Inch of the second pixel units within the central display region, comprises: a distance between adjacent first pixel units within the peripheral display region is smaller than a distance between adjacent second pixel units within the central display region, and an area of the first pixel unit is larger than an area of the second pixel unit.

14. The preparation method according to claim 13, wherein the first pixel unit comprises N first light emitting units, and the second pixel unit comprises N second light emitting units, wherein N is a positive integer;

preparing the multiple first pixel units regularly arranged in the peripheral display region and preparing the multiple second pixel units regularly arranged in the central display region, comprises:

preparing multiple first opening regions regularly arranged in the peripheral display region, and preparing multiple second opening regions regularly arranged in the central display region; and by ink-jet printing, spraying a first organic functional solution in the first opening region to form an organic functional layer of a first light emitting unit, and spraying a second organic functional solution in the second opening region to form an organic functional layer of a second light emitting unit, wherein a solvent concentration of the first organic functional solution is greater than a solvent concentration of the second organic functional solution.

* * * * *